United States Patent

Merchant et al.

[11] Patent Number: 6,114,234
[45] Date of Patent: Sep. 5, 2000

[54] METHOD OF MAKING A SEMICONDUCTOR WITH COPPER PASSIVATING FILM

[75] Inventors: Sailesh M. Merchant; Sudhanshu Misra; Pradip K. Roy, all of Orlando, Fla.

[73] Assignee: Lucent Technologies Inc., Murray Hill, N.J.

[21] Appl. No.: 09/338,735

[22] Filed: Jun. 23, 1999

[51] Int. Cl.[7] .................. H01L 21/4763; H01L 21/44; H01L 21/302; H01L 21/461

[52] U.S. Cl. .................. 438/631; 438/633; 438/638; 438/687; 438/692; 438/626

[58] Field of Search .................. 438/622, 625, 438/626, 629, 631, 634, 642, 645, 694, 697, 754, 687, 635, 692

[56] References Cited

U.S. PATENT DOCUMENTS 5,780,358  7/1998  Zhou et al. .................. 438/645

OTHER PUBLICATIONS

Carpio et al, "Initial study on copper CMP slurry chemistries", Thin Solid Films 266: 238–244, 1995.

Aruna Bahadur, "Study of film growth on copper in chromate solution by a radioactive tracer technique", Journal of Materials Science Letters, vol. 17 No. 8; pp. 701–704, Apr. 1998.

*Primary Examiner*—Chandra Chaudhari
*Assistant Examiner*—Thanhha Pham
*Attorney, Agent, or Firm*—Allen, Dyer, Doppelt, Milbrath & Gilchrist, P.A.

[57] ABSTRACT

A method of making a semiconductor with a passivating film for copper interconnects includes the step of etching a first set of trench openings within a second oxide layer and then through an etch stop layer that has been deposited over a first oxide layer on a semiconductor substrate. At least a second set of openings are etched in the first oxide layer within the bounds defined by each of a first set of openings. A copper layer is deposited and a passivating film formed on top of the deposited copper layer by depositing one of either a chromate or chromite on the deposited copper layer and forming a respective copper chromate or copper chromite composition. The passivating film is chemically mechanically polished with a slurry containing a respective nitric acid when the passivating film is formed from a chromite and ammonium hydroxide when the passivating film is formed from a chromate.

14 Claims, 6 Drawing Sheets

METHOD OF MAKING A SEMICONDUCTOR WITH COPPER PASSIVATING FILM

FIELD OF THE INVENTION

This invention relates to the field of semiconductor manufacturing, and more particularly, this invention relates to the field of semiconductor manufacturing using passivation films for copper.

BACKGROUND OF THE INVENTION

In the manufacture of semiconductor wafers and integrated circuits, metal films are deposited on semiconductor substrates, oxides and other dielectrics. These metal films are used for different purposes, such as forming interconnect lines, metallic contacts, conductive vias, metallic interconnects and other conductive features on and above various surfaces of semiconductor wafers.

Typically, aluminum has been a preferred conductive metal because it avoids various problems, such as a high contact resistance with silicon, which normally accompanies the use of gold and copper. Copper also suffers drawbacks compared to aluminum because copper migrates into device areas, causing problems in device performance. Aluminum, on the other hand, has good adhesion to silicon dioxide and performs well with plasma etching, as compared to copper, which does not perform adequately with plasma etching processes.

Recently, greater interest has been shown by manufacturers of semiconductor devices in the use of copper and copper alloys for metallization patterns, such as in conductive vias and patterns. Copper has a lower resistivity than aluminum. Unfortunately, the standard processes used for pattern definition with semiconductors have not been adequately used with copper integrated circuit metallization. These processes include conventional dry etched techniques and selective deposition techniques. However, chemical mechanical polishing (CMP) techniques have been found useful in patterning copper layers. A drawback with CMP is that copper layers and vias are prone to heavy oxidation, which can cause dishing during the chemical mechanical polishing step. In one prior art technique, an HF wet cleaning step has been added to copper. This could include in one of the processing steps an anode water treatment. This can occur before HF clean and after CMP. However, this prior art technique is inefficient.

SUMMARY OF THE INVENTION

It is therefore an object of the present invention to provide a method of making a semiconductor with a passivating film of copper that overcomes the disadvantages of the prior art.

In accordance with the present invention, a method of making a semiconductor with a passivating film for copper comprises the steps of depositing a first oxide layer over a semiconductor substrate. An etch stop layer is formed over the oxide layer. A second oxide layer is formed over the etch stop layer. The method further comprises the step of etching a first set of trench openings within the second oxide layer and then through the etch stop layer. At least a second set of openings are etched in the first oxide layer within the bounds defined by each of the first set of openings.

The method further comprises the step of depositing a copper layer at least over selected portions of the second oxide layer, such that copper is deposited within the first and second sets of openings and over at least portions of the second oxide layer adjacent the first set of trench openings.

A passivating film is formed on top of the deposited copper layer by depositing one of either a chromate or chromite on the deposited copper layer and forming a respective copper chromate or copper chromite composition. The method also comprises the step of chemically mechanically polishing the passivating film with a slurry containing a respective nitric acid when the passivating film is formed from a chromite and ammonium hydroxide when the passivating film is formed from a chromate.

In still another aspect of the present invention, the method comprises the step of locally forming the passivating film by electrochemical deposition of the selected one of either chromite or chromate at selected portions of the deposited copper. After the step of chemical mechanical polishing, the method further comprises the step of adding another passivation layer, followed by the step of chemical mechanical polishing.

The etch stop layer can be formed as a silicon nitride layer. The slurry pH can be maintained between about 5 to about 7 when chemically mechanically polishing a chromite passivation layer, and maintaining a slurry pH of about 7 to about 9 when chemically mechanically polishing a chromate passivation layer. The method can also comprise the step of depositing a selected one of the chromate or chromite passivation layer by passing the semiconductor substrate through a heating oven and depositing the chromite or chromate onto the deposited copper layer. The method also comprises the step of depositing the copper layer by one of electrodeposition, electroplating or chemical vapor deposition. The method can be used with standard processes including damascene and dual damascene processes, also known as in-laid metal semiconductor processes.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention is advantageous because a passivating film for copper can be used in the manufacture of a semiconductor device where copper interconnects are desired and formed from deposited copper layers. Copper has been prone to oxidation and the use of the passivating film of the present invention prevents oxidation and allows chemical mechanical polishing of the passivating film with a slurry. The passivation film is a chromium-containing copper film layer that is formed from a chromate or chromite. The film can be deposited electrochemically, allowing local generation of the film anywhere in the deposited copper layer. This type of passivation film allows the polishing rate to be modulated above formed vias and trenches during chemical mechanical polishing, thereby controlling various dishing properties.

Figure 1:
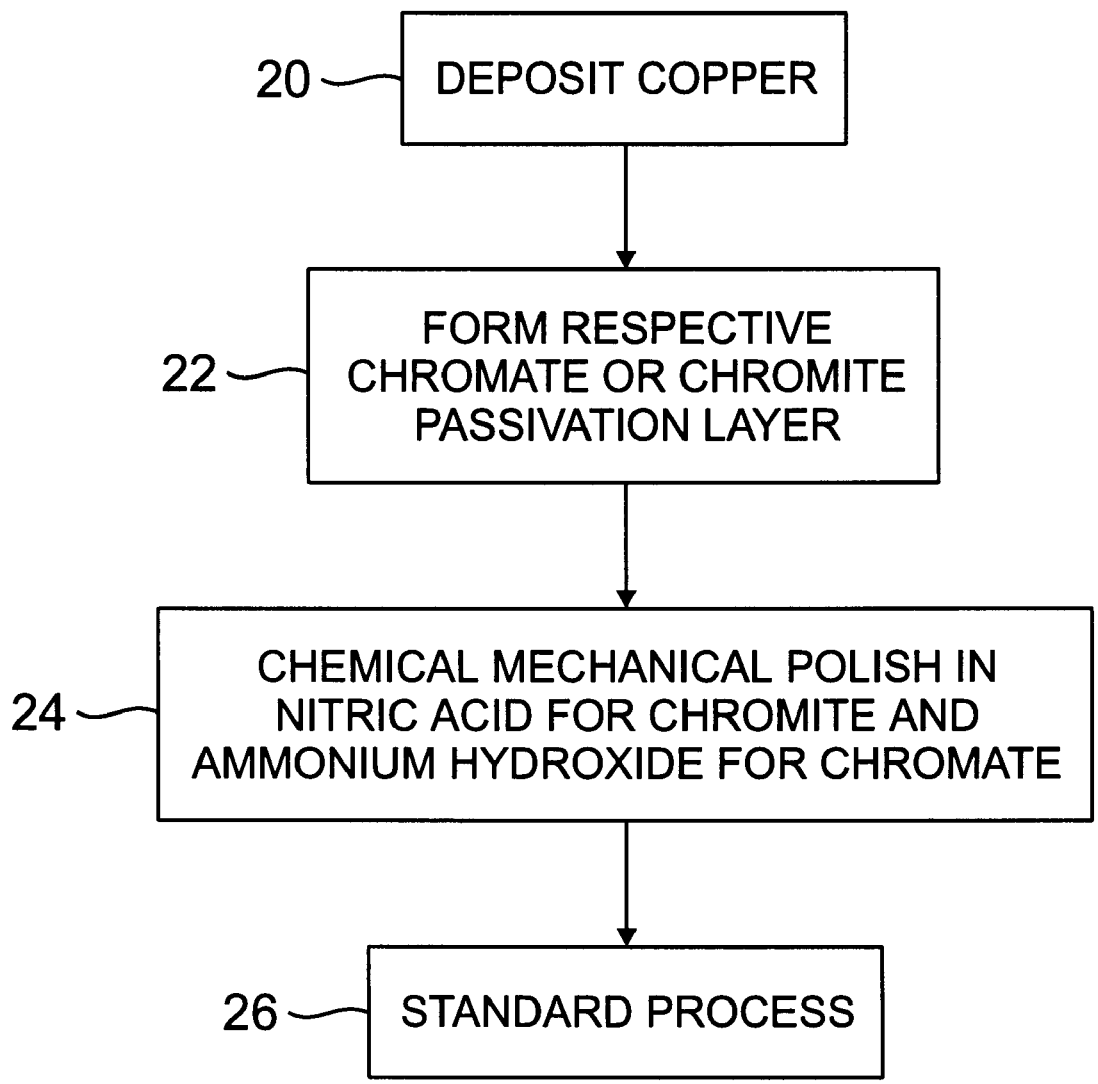
FIG. 1 is a flow chart showing the basic elements of the method of the present invention.

Referring now to the flow chart of FIG. 1, there is illustrated the basic steps of the present invention that forms the passivation film that protects a deposited copper layer. In accordance with the present invention, a copper layer is deposited by normal techniques, such as CVD or electroplating and electrodeposition (block 20). A respective chromate or chromite passivation layer is formed over the deposited copper layer (block 22). The semiconductor material is subjected to chemical mechanical polishing in a slurry having nitric acid for chromite, and a slurry having ammonium hydroxide for chromate (block 24). The wafer then is subjected to the standard processing as known to those skilled in the art (block 26).

Referring now to FIGS. 2–5, there is illustrated a dual damascene process that is used with the present invention in forming the passivating film for copper. As shown in FIG. 1, a semiconductor substrate 30 is provided, and a first oxide layer 32 is deposited over the semiconductor substrate by techniques known to those skilled in the art. The semiconductor substrate 30 and associated other layers form a semiconductor wafer 31 as known to those skilled in the art. Although the first oxide layer 32 is formed as a silicon dioxide, other dielectrics can be used as known to those skilled in the art, as long as the dielectric does not affect the formation of the passivation layer and the copper interconnects of the present invention.

Figure 2:
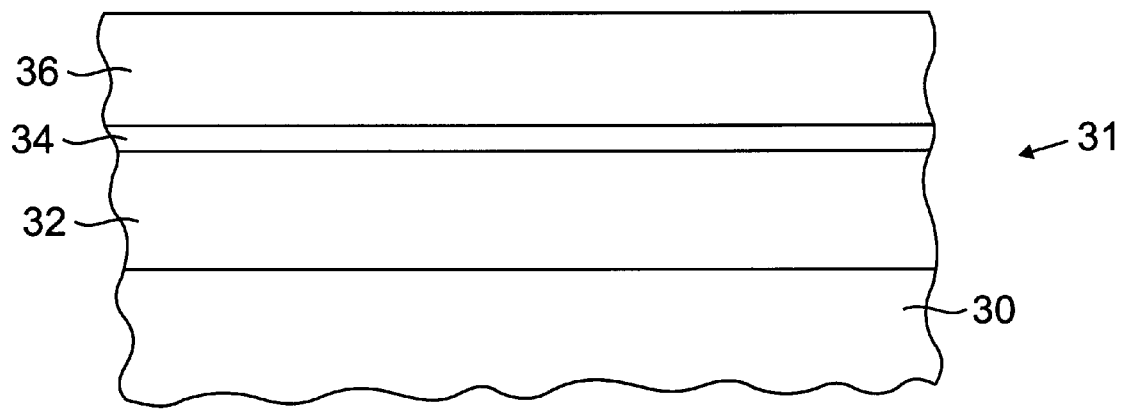
FIGS. 2–5 illustrate a dual damascene process where the passivation layer of the present invention is used for forming a passivating layer on the deposited copper layer.

An etch stop layer 34 is formed over the first oxide layer 32 as illustrated. The etch stop layer 34 is typically formed from silicon nitride and deposited by techniques known to those skilled in the art. This non-conductive silicon nitride layer typically is chemically deposited on the wafers and associated oxide layers at temperatures between about 600° C. and 900° C. A second oxide layer 36 is then formed over the etch stop layer as shown in FIG. 2.

Figure 3:
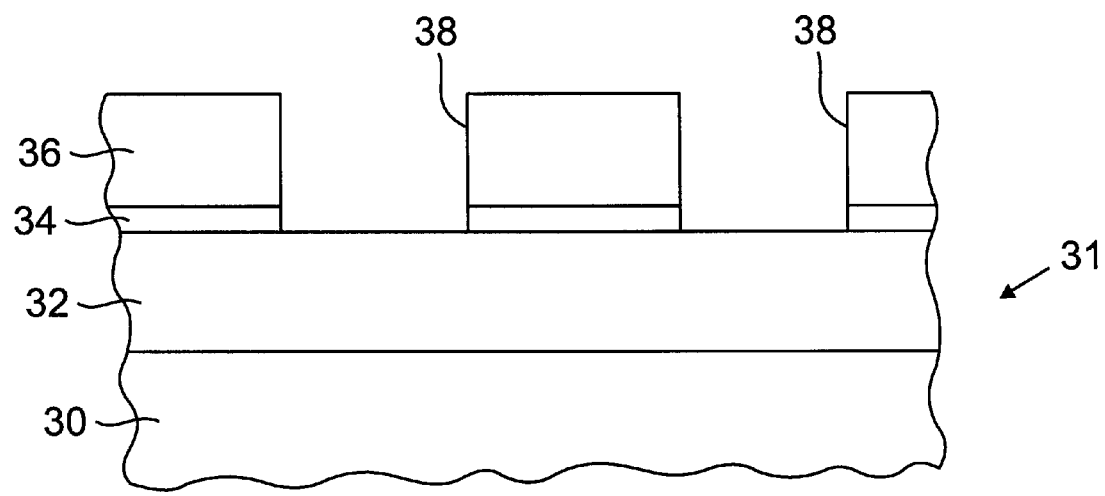

As shown in FIG. 3, a first set of openings 38 are formed as trenches within the second oxide layer and then formed through the etch stop layer 34. Although the present description proceeds with the etching of the second oxide layer 36 followed by the etching of the etch stop layer 34, other etching steps for etching the second oxide layer and the etch stop layer can be used as suggested to those skilled in the art. The openings, e.g., trenches 38, will later form in-laid metallization conductors as will be explained below.

Figure 4:
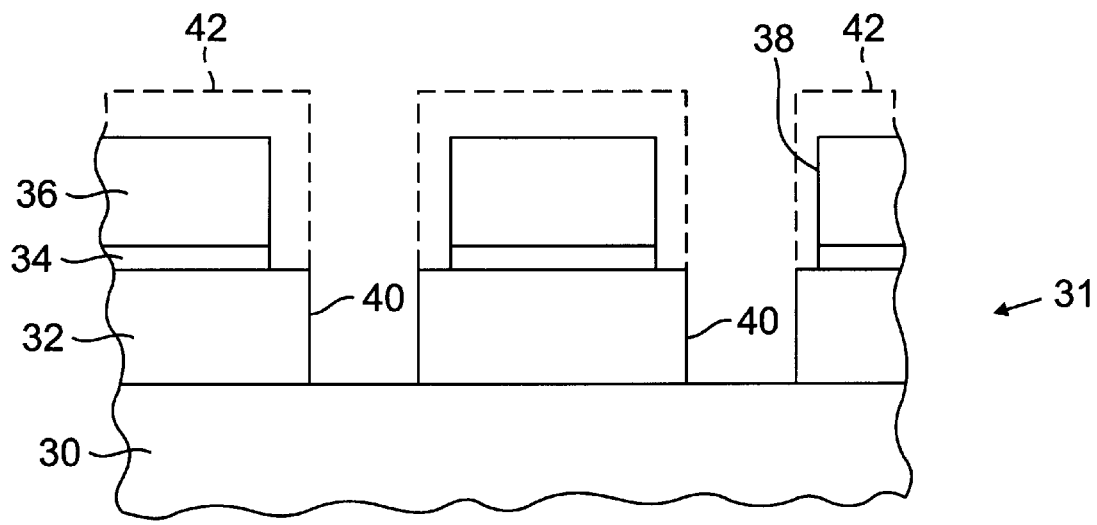

As is known in the damascene process as shown in FIG. 4, at least a second set of selected openings 40 are etched in the first oxide layer within the bounds defined by each of the first set of openings. A photo resist shown by the dashed lines at 42 is applied to form the second set of openings 40. The photo resist is then removed by techniques known to those skilled in the art. This second set of openings 40 form the interconnects and vias between different layers, as is well known to those skilled in the art. The interconnects form the vias that connect to the semiconductor structure and layers on the silicon substrate, which have a predetermined conductivity type and various dopants, forming semiconductor devices, as is well known to those skilled in the art.

Figure 5:
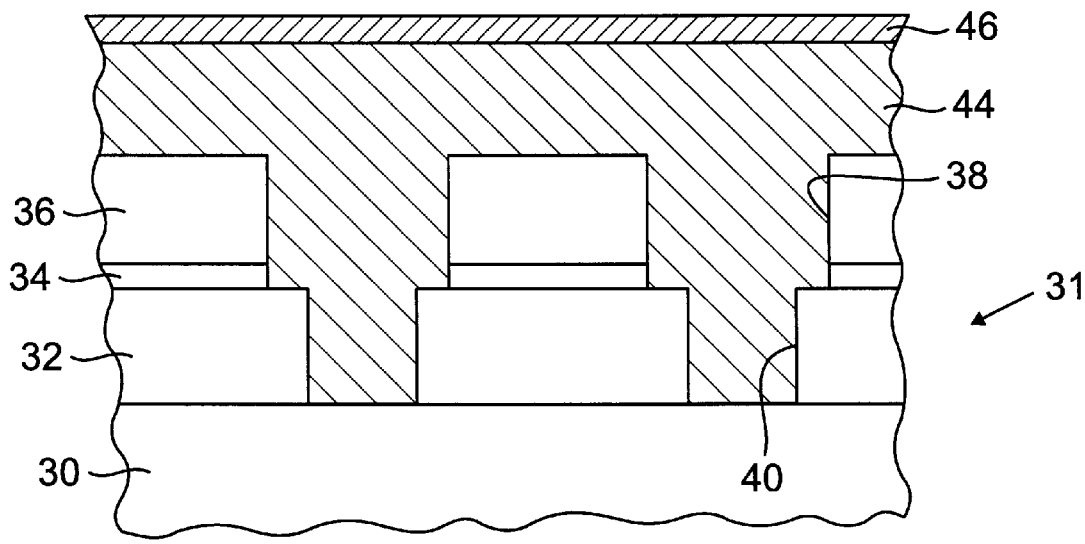
Figure 6:
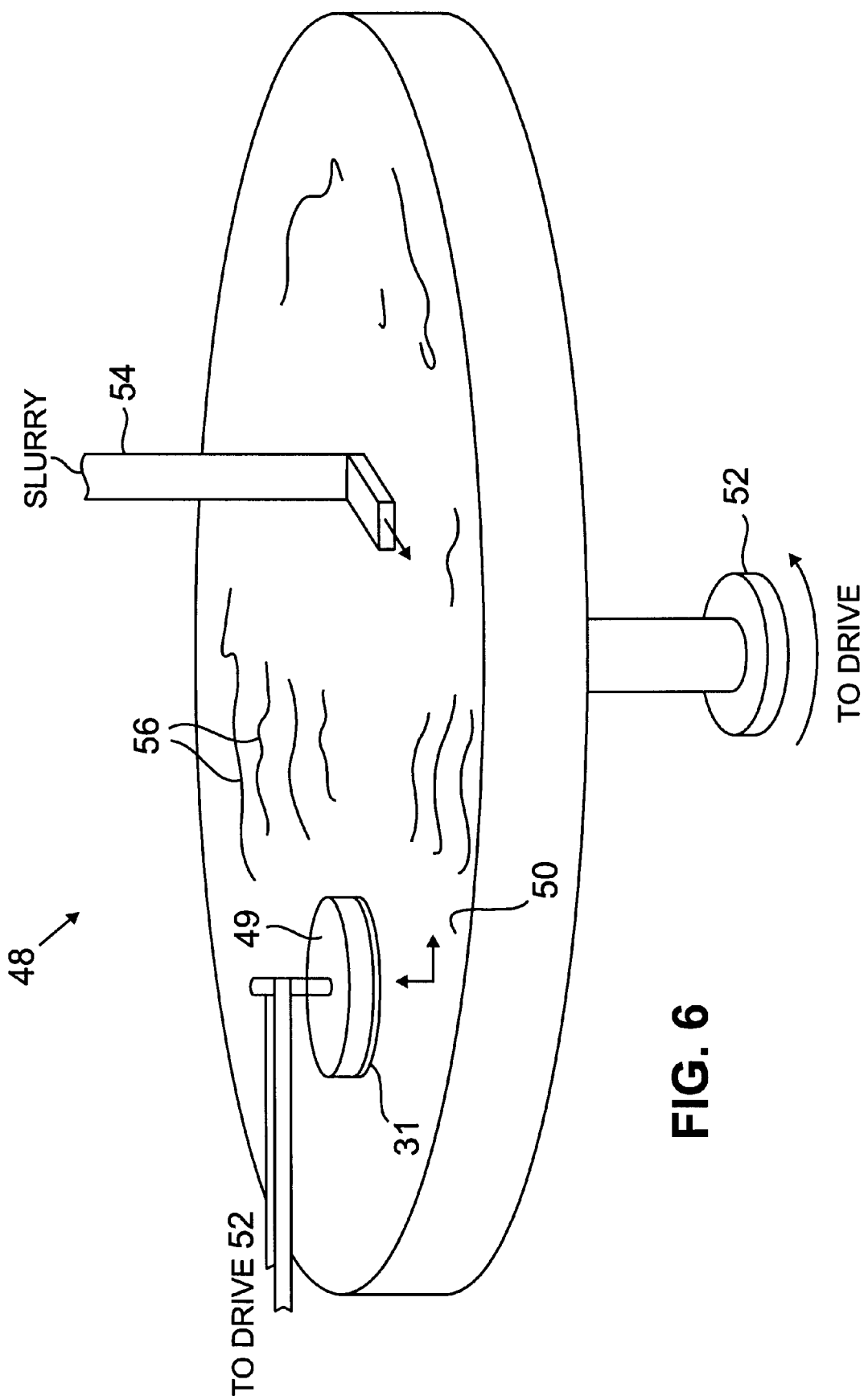
FIG. 6 is a schematic, isometric view of a chemical mechanical polishing process where a wafer having a passivating layer for a copper layer is polished.
Figure 7:
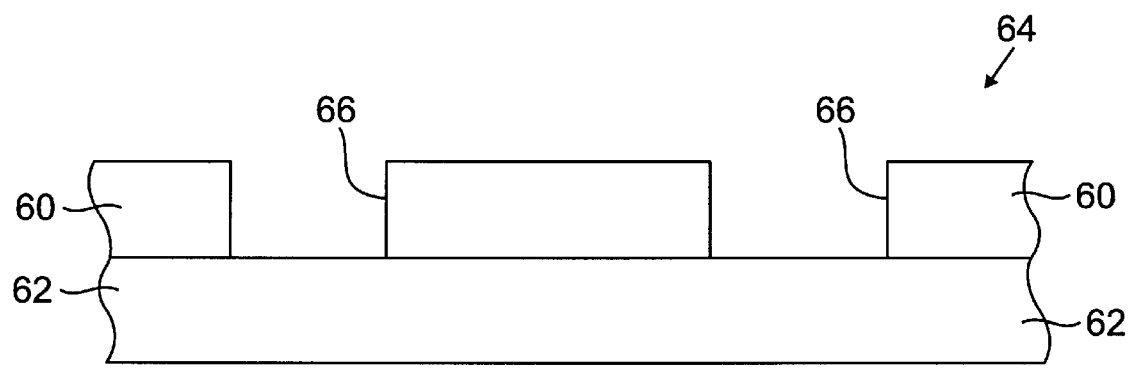
FIGS. 7–10 illustrate a single damascene process where the passivation layer is applied to the deposited copper layer in accordance with the present invention.

As shown in FIG. 5, a copper layer 44 is deposited at least over selected portions of the second oxide layer 36, such that the copper layer 44 is deposited within the first and second sets of openings 38, 40 and over at least portions of the second oxide layer 36 adjacent the first set of openings forming the trenches 38. As illustrated, the copper layer 44 can form a layer over the entire surface. However, only selected portions can be deposited with the copper layer. The copper layer 44 can be deposited by electrodeposition, electroplating or chemical vapor deposition techniques well known to those skilled in the art.

The thicknesses of the various layers can vary as known to those skilled in the art. For example, the first oxide layer 32 can be deposited over the substrate by chemical vapor deposition (CVD) from a TEOS source gas and could have a thickness of about 4,000 to 6,000 angstroms or even more. The second oxide layer 36 can also be formed in a similar thickness range, although ranges as high as 8,000 angstroms are not uncommon. The appropriate silicon nitride etch stop layer 34 can have a thickness between about 200 to 1,500 angstroms in one embodiment. Naturally, this is only a range of thickness, which can vary depending on the thickness desired by those skilled in the art and the end use of the semiconductor devices.

A passivating film 46 is then formed on top of the deposited copper layer 44 by depositing one of either a chromate or chromite on the deposited copper layer and forming a respective copper chromate or copper chromite composition. The passivating layer deposition could be formed by passing the wafer through a heating oven and depositing the chromite or chromate onto the deposited copper layer 44. It is also possible to use other techniques, even a wet technique. The semiconductor wafer and associated layers are then passed to a mechanical tool 48 for performing chemical mechanical polishing on the wafer 31. The wafer 31 is carried by wafer carrier 49 and placed face-down on a polishing pad 50 so that the wafer surface to be polished rests against the surface of the polishing pad 50. Various drive mechanisms 52 provide the rotation and movement of a wafer 31 relative to the polishing pad 50. The polishing pad can rotate in operation.

A slurry delivery system 54 allows a slurry 56 to flow over the surface of the polishing pad 50 during the chemical mechanical polishing operation. The slurry contains many of the components known to those skilled in the art, including an abrasive, inorganic material, such as silicon dioxide, and other compound elements known to those skilled in the art. It can include surfactants to activate the surface, and corrosion inhibitors, such as a BTA, often used for copper. The slurry 56 contains a nitric acid (HNO3) when the passivating film is formed from a chromite. The slurry contains an ammonium hydroxide (NH4OH) when the passivating film is formed from a chromate.

The passivating film 46 could also be formed by electrochemical deposition of the selected chromite or chromate at selected portions of the deposited copper layer 44 to allow local formation of the passivating film. In one aspect of the present invention, a pH is maintained in the slurry between about 5 and about 7 when chemically mechanically polishing a chromite passivation layer. The pH can be maintained between about 7 and about 9 when chemically mechanically polishing a chromate passivation layer. Thus, it is possible to modulate the polishing rate above variously formed vias and trenches during the chemical and mechanical polishing by controlling the amount of nitric acid and/or ammonium hydroxide, depending on the chromate and chromites that have been formed. pH can also be controlled. Thus, dishing properties can be controlled. The decision to use chromate or chromite depends on the end use, type of processing, the copper and other factors suggested by those skilled in the art.

The type of processing can be detected by various analytical electron metallography, AES and Secondary Ion Mass Spectrometry (SIMS).

Figure 8:
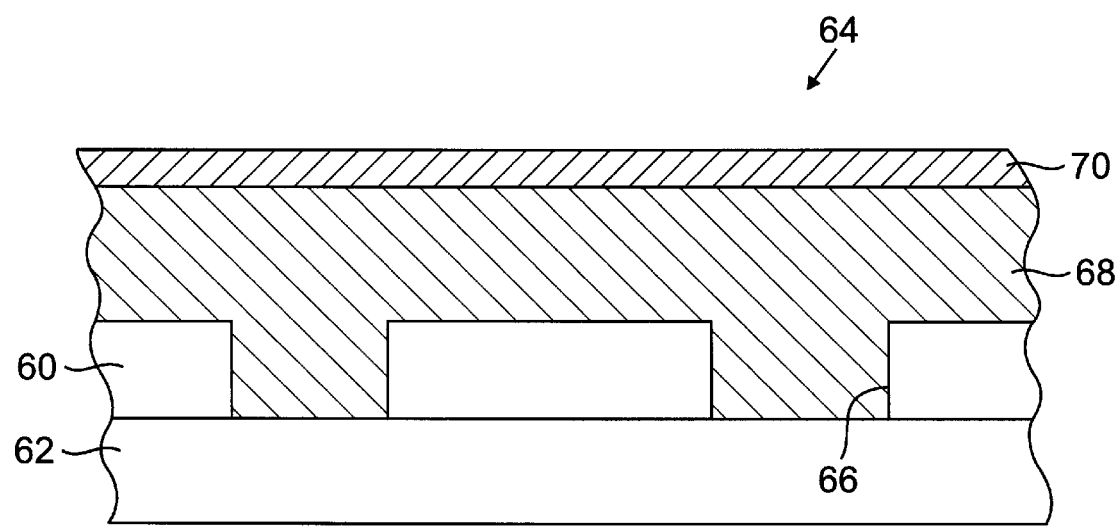
Figure 9:
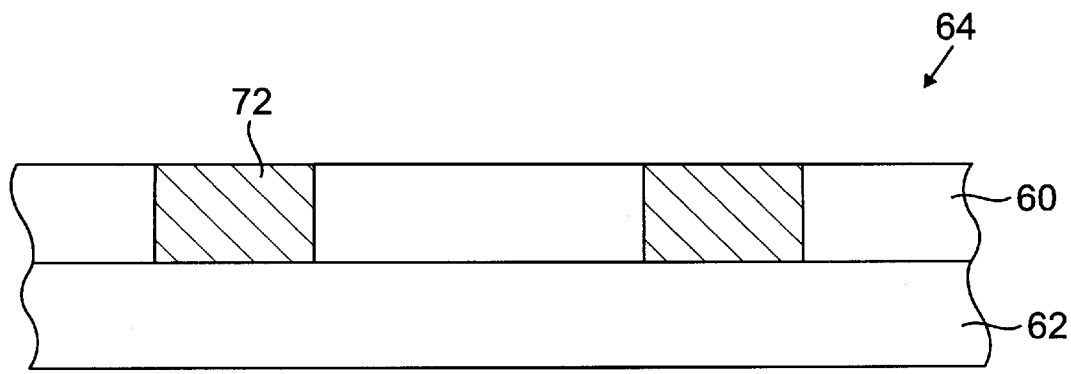
Figure 10:
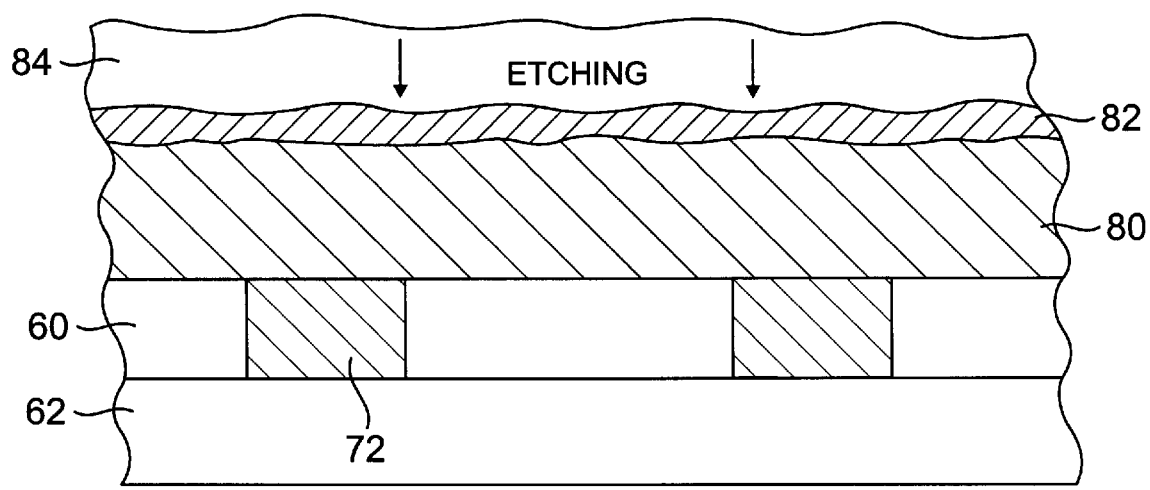

Referring now to FIGS. 7–10, a single damascene process is illustrated with the present invention, where an oxide layer 60 is deposited over a semiconductor substrate 62 forming the wafer 64. An in-laid pattern is etched as trenches 66 within the oxide layer 60. The etching can occur by techniques known to those skilled in the art. A copper layer 68 is deposited within the etched trenches 66 and over a substantial portion of the semiconductor oxide layer 60 adjacent the etched trenches (FIG. 8). The copper layer 68 could be deposited over the entire surface, and is deposited by techniques described above. In accordance with the present invention, a passivating film 70 is formed on top of the deposited copper layer 68 by depositing one of a chromate or chromite on the deposited copper layer and forming a respective copper chromate or copper chromite composition. The passivating film 70 can be chemically mechanically polished with the slurry containing the respective nitric acid when the passivating film is formed from a chromite and ammonium hydroxide when the passivating film is formed from a chromate so as to form in-laid metallization vias 72 as illustrated in FIG. 9.

It is still possible to deposit a second copper layer 80 (FIG. 10) over the oxide layer 60 and vias at the formed in-laid metallization vias 72 and another passivating film 82 can be formed on top of the second deposited copper layer 80 by depositing one of a chromate or chromite on the deposited copper layer and forming a respective copper chromate or copper chromite composition. Etching with the respective mask 84 can occur as explained above. Then the passivating film can be chemically mechanically polished as described and in-laid metallization conductors formed.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method of making a semiconductor with a passivating film for copper interconnects comprising the steps of:
    depositing a first oxide layer over a semiconductor substrate;
    forming an etch stop layer over the first oxide layer;
    forming a second oxide layer over the etch stop layer;
    etching a first set of openings within the second oxide layer and then through the etch stop layer;
    etching at least a second set of openings in the first oxide layer within the bounds defined by the first set of openings;
    depositing a copper layer at least over selected portions of the second oxide layer such that copper is deposited within the first and second sets of openings and over at least portions of the second oxide layer adjacent the first set of openings;
    forming a passivating film on top of the deposited copper layer by depositing a chromite and forming a respective copper chromite composition; and
    chemically mechanically polishing the passivating film with a slurry containing a nitric acid.

2. A method according to claim 1, and comprising the step of locally forming the passivating film by electrochemical deposition of chromite at selected portions of the deposited copper.

3. A method according to claim 1, wherein after the step of chemically mechanically polishing the passivating film, the method further comprises a step of adding another passivation layer, followed by a step of chemical mechanical polishing.

4. A method according to claim 1, and comprising the step of forming the etch stop layer as a silicon nitride layer.

5. A method according to claim 1, and comprising the step of maintaining a slurry pH between about 5 to about 7 when chemically mechanically polishing the passivating film.

6. A method according to claim 1, and comprising the step of forming the passivating film by passing the semiconductor substrate through a heating oven and depositing the chromite onto the deposited copper layer.

7. A method according to claim 1, and comprising the step of depositing the copper layer by one of electrodeposition, electroplating or chemical vapor deposition.

8. A method of making a semiconductor with a passivating film for copper interconnects comprising the steps of:
    depositing an oxide layer over a semiconductor substrate;
    etching an in-laid pattern as trenches within the oxide layer;
    depositing a copper layer within the etched trenches and over a substantial portion of the oxide layer adjacent the etched trenches;
    forming a passivating film on top of the deposited copper layer by depositing a chromite and forming a respective copper chromite composition; and
    chemically mechanically polishing the passivating film with a slurry containing a nitric acid so as to form in-laid metallization vias.

9. A method according to claim 8, wherein after the step of chemically mechanically polishing the passivating film, the method further comprises a step of adding another passivation layer, followed by a step of chemical/mechanical polishing.

10. A method according to claim 8, and comprising the step of maintaining a slurry pH of about 5 to 7 when chemically mechanically polishing the passivating film.

11. A method according to claim 8, and comprising the step of forming the passivating film by passing the semiconductor substrate through a heating oven and depositing the chromite onto the deposited copper layer.

12. A method according to claim 8, and comprising the step of depositing the copper layer by one of electrodeposition, electroplating or chemical vapor deposition.

13. A method according to claim 8, and further comprising a step of depositing a second copper layer over the oxide layer at the formed in-laid metallization vias;
    forming a second passivating film on top of the second deposited copper layer by depositing a chromite and forming a respective copper chromite composition;
    chemically mechanically polishing the second passivating film with a slurry containing a nitric acid; and
    forming in-laid metallization conductors.

14. A method according to claim 13, and comprising the step of locally forming the passivating film by electrochemical deposition of chromite at selected portions of the deposited copper.

* * * * *

UNITED STATES PATENT AND TRADEMARK OFFICE
CERTIFICATE OF CORRECTION

PATENT NO. : 6,114,234
DATED : September 5, 2000
INVENTOR(S) : Merchant et al

It is certified that error appears in the above-identified patent and that said Letters Patent is hereby corrected as shown below:

On the title page:

Item [56]  Add the following cited references:
References Cited

U.S. PATENT DOCUMENTS

| | | | |
|---|---|---|---|
| 4,789,648 | 12/1988 | Chow et al. | 438/633 |
| 5,595,937 | 01/1997 | Mikagi | 438/626 |
| 5,736,457 | 04/1998 | Zhao | 438/624 |
| 5,773,364 | 06/1998 | Farkas et al. | 438/692 |
| 5,801,094 | 09/1998 | Yew et al. | 438/624 |
| 5,840,629 | 11/1998 | Carpio | 438/692 |

Signed and Sealed this

Fifteenth Day of May, 2001

Attest:

NICHOLAS P. GODICI

Attesting Officer    Acting Director of the United States Patent and Trademark Office